United States Patent [19]
Tsuchiya et al.

[11] Patent Number: 5,134,450
[45] Date of Patent: Jul. 28, 1992

[54] PARALLEL TRANSISTOR CIRCUIT WITH NON-VOLATILE FUNCTION

[75] Inventors: Kazuhisa Tsuchiya; Kazuya Miyazaki; Satoshi Hatsumori, all of Sendai; Satoshi Sekine, Yokohama; Taichi Morikawa, Aizuwakamatsu, all of Japan

[73] Assignee: Motorola, Inc., Schaumburg, Ill.

[21] Appl. No.: 682,824

[22] Filed: Apr. 9, 1991

[30] Foreign Application Priority Data

Apr. 13, 1990 [JP] Japan .................................. 2-98750

[51] Int. Cl.⁵ .................... H01L 29/68; H01L 27/02; G11C 11/34
[52] U.S. Cl. .................................. 357/23.5; 357/41; 365/185
[58] Field of Search .................... 357/23.5; 365/185

[56] References Cited

FOREIGN PATENT DOCUMENTS 190069 11/1983 Japan .................................. 357/23.5

Primary Examiner—Rolf Hille
Assistant Examiner—Robert Limanek
Attorney, Agent, or Firm—Eugene A. Parsons

[57] ABSTRACT

A parallel transistor circuit 10 with non-volatile function is provided on a single semiconductor body, comprising an enhancement-type MOS transistor 1 having a drain electrode 25a connected to a drain node 25c, a gate electrode 37a connected to a gate node 37c, and a source electrode 23a connected to a source node 23c; and a floating gate-type MOS transistor 3 having a drain electrode 25b connected to the drain node, a floating gate 33, a control gate electrode 37b connected to the gate node, and a source electrode 23b connected to the source node.

2 Claims, 2 Drawing Sheets

PARALLEL TRANSISTOR CIRCUIT WITH NON-VOLATILE FUNCTION

FIELD OF THE INVENTION

The present invention relates, in general, to a parallel transistor circuit with non-volatile function. More particularly, the invention relates to a semiconductor memory device formed by a plurality of such parallel transistor circuits.

BACKGROUND OF THE INVENTION

It is known in the art to form EEPROM or EPROM semiconductor memory cell utilizing a single floating gate-type MOS transistor or utilizing serially connected such floating gate-type transistor and a MOS transistor which is used for cell selection. The floating gate-type transistor can store non-volatile information by injecting or removing electrons to the floating gate. A memory device can be constructed by arraying a plurality of such memory cells.

However, in this prior memory array structure using a single floating gate-type transistor or serially connected the floating gate-type transistor and MOS transistor, a large area of semiconductor body is required because each bit line contact is necessary for each cell due to an NOR logic structure, obstructing the improvement of integration of the memory.

SUMMARY OF THE INVENTION

Accordingly, it is an object of the present invention to provide an improved parallel transistor circuit with non-volatile function.

More particularly, it is an object of the present invention to provide an improved memory device constructed by arraying a plurality of such parallel transistor circuits requiring the minimum area of a semiconductor body.

In carrying out the above and other objects of the invention in one form, there is provided a parallel transistor circuit with non-volatile function formed on a single semiconductor substrate, comprising an enhancement-type MOS transistor having a drain electrode connected to a drain node, a gate electrode connected to a gate node, and a source electrode connected to a source node; and a floating gate-type MOS transistor having a drain electrode connected to said drain node, a floating gate, a control gate electrode connected to said gate node, and a source electrode connected to said source node.

These and other objects and advantages will be apparent to one of skill in the art from the detailed description below taken together with the drawings.

DETAILED DESCRIPTION OF THE INVENTION

Figure 1:
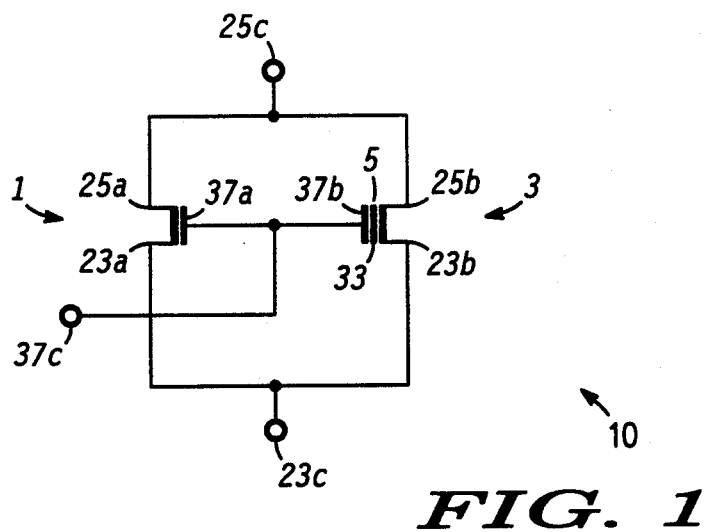
FIG. 1 shows a preferred embodiment of a parallel transistor circuit according to the present invention.

Referring to FIG. 1, there is shown a preferred embodiment of a parallel transistor circuit according to the present invention. The circuit 10 includes an enhancement-type MOS transistor 1 and a floating gate-type FET MOS transistor 3. MOS transistor 1 has a drain electrode 25a connected to a drain node 25c, a gate electrode 37a connected to a gate node 37c, and a source electrode 23a connected a source node 23c. Floating gate-type transistor 3 has a drain electrode 25b connected to drain node 25c, a control gate electrode 37b connected to gate node 37c, and a source electrode 23b connected source node 23c. Transistor 3 further includes a floating gate 33 placed between and insulated from control gate 37b and a channel (not shown).

In operation, when gate node 37c receives a voltage lower than Vth, where Vth is the threshold voltage of MOS transistor 1, transistor 1 will be turned off. Thus with low gate voltage, whole circuit 10 will be equivalent to FET MOS transistor 3 only, and therefor will operate depending upon charge information stored in floating gate 33. More specifically, if floating gate 33 stores enough electrons, MOS transistor 3 will be a normally-off transistor. On the contrary, if electrons are not stored in floating gate 33, MOS transistor 3 will be a normally-on transistor.

Electrons can be injected to and removed from floating gate 33, for example, by electric field effect (EFE). That is, a high electric field is applied between gate 37b and source/drain in order to inject electrons from source/drain to floating gate 33 or remove them from floating gate 33 to the source/drain. Alternatively, the injection and removal of electrons may be performed between control gate 37b and floating gate 33.

When the gate voltage at node 37c is higher than the threshold voltage Vth of MOS transistor 1, transistor 1 will be turned on. Thus with high gate voltage, circuit 10 will be conductive irrespective of the charge information stored in floating gate 33.

Figure 2A:
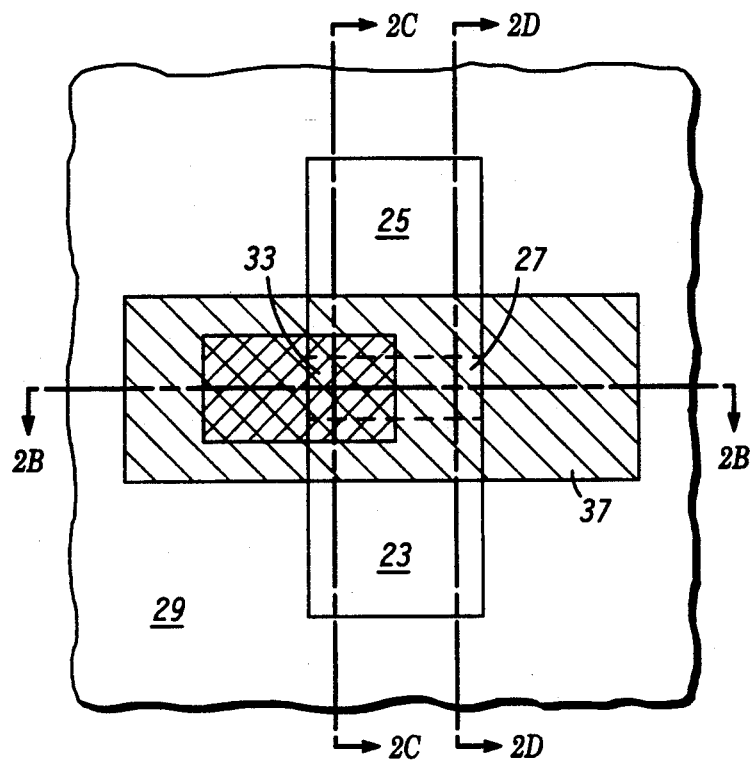
FIGS. 2A-2D illustrate the structure of a preferred memory device equivalent to the circuit of FIG. 1.
Figure 2B:
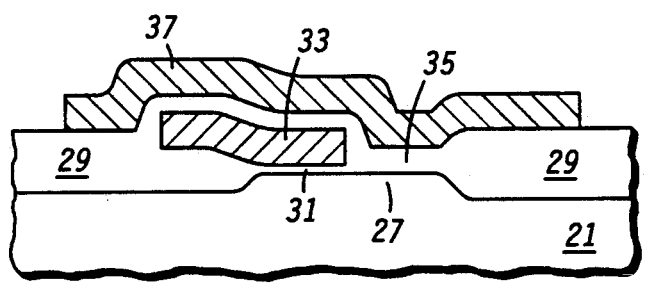
Figure 2C:
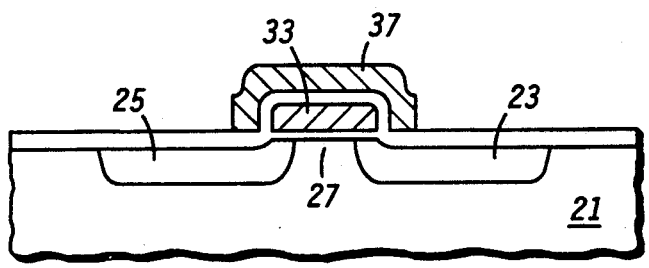
Figure 2D:
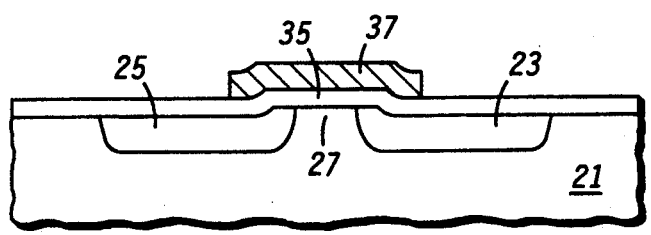

Referring to FIGS. 2A-2D, the equivalent circuit of FIG. 1 is fabricated in a single body of semiconductor material using ordinary techniques. FIG. 2A shows the top plan view of the device. FIGS. 2B, 2C and 2D illustrate cross sectional views taken along lines B—B, C—C and D—D in FIG. 2A, respectively. Similar reference numerals indicate corresponding parts throughout the several views of the drawings. For convenience of explanation, certain semiconductor regions are defined as P or N herein. However, those of skill in the art will understand that this is merely for ease of explanation and not intended to be limiting, and that the invention being described includes arrangements where the conductivity types are inverted or where other combinations of P and N regions are used.

As shown, the parallel transistor circuit device according to the present invention is formed in a P-type semiconductor substrate 21. An N-type source diffusion region 23 and also an N-type drain diffusion region 25 are formed in substrate 21. A channel region 27 is extending with the width of 1 μ between source diffusion region 23 and drain diffusion region 25. These source diffusion region 23, drain diffusion region 25 and channel region 27 are separated from other devices by field oxidation layers 29 made of $SiO_2$. A thin insulation oxidation layer 31 having the thickness of approximately 100 Å is formed on a portion of channel region 27 as shown in FIG. 2B. A floating gate electrode 33 of polycrystalline silicon having the thickness of a few microns is formed on insulation layer 31. A thick oxidation layer 35 having the thickness of 300–400 Å is formed on both floating gate 33 and a remaining portion of channel region 27 as shown in FIG. 2B. A control gate electrode and gate electrode 37 is formed on thick oxidation layer 35. In the manner shown in FIGS. 2A-2D, drain region 25 is used in common as the drain of MOS transistor 1 and also as the drain of floating gate-type MOS transistor 3 of FIG. 1. Similarly source region 23 is used in common as the source of MOS transistor 1 and also as the source of floating gate-type MOS transistor 3 of FIG. 1. Two channels of MOS transistor 1 and floating gate-type MOS transistor 3 are connected contiguously to each other. Accordingly, the parallel transistor device according to the present invention requires a very small area of semiconductor body. Although oxidation layer 35 is shown as thicker than oxidation layer 31 in FIG. 2B, alternatively oxidation layer 35 may be thinner than oxidation layer 31.

Now an example of processes fabricating the parallel transistor circuit device of FIGS. 2A-2D will be briefly explained.

(1) First, field oxidation layers 29 are formed in semiconductor substrate 21 to leave an active region therebetween by using ordinary techniques including a local oxidation of silicon method (LOCOS). The active region will have therein source diffusion region 23, drain diffusion region 25 and channel 27.

(2) Thin oxidation layer 31 having a thickness of approximately 100 Å is formed on a portion of channel region 27 as shown in FIG. 2B. Then a polycrystalline silicon layer is deposited on the device and doped with adequate impurity to lower its resistivity. The doped poly-silicon layer is patterned (as shown in FIGS. 2A and 2B) using ordinary photolithographic techniques to form floating gate electrode 33.

(3) Next, source diffusion region 23, drain diffusion region 25 and channel 27 therebetween are formed using photo-mask process and ion implantation techniques.

(4) Gate oxidation layer 35 is formed on floating gate 33 and also on a remaining portion of channel 27.

(5) A poly-silicon layer is deposited on thus formed gate oxidation layer 35, doped and diffused with impurity for lowering its resistivity, and patterned using photo-mask etching techniques to form control gate electrode 37.

(6) Finally, interconnecting aluminum metallization and passivation layer (not shown) are placed on the device conventional MOS transistor fabricating processes.

Figure 3:
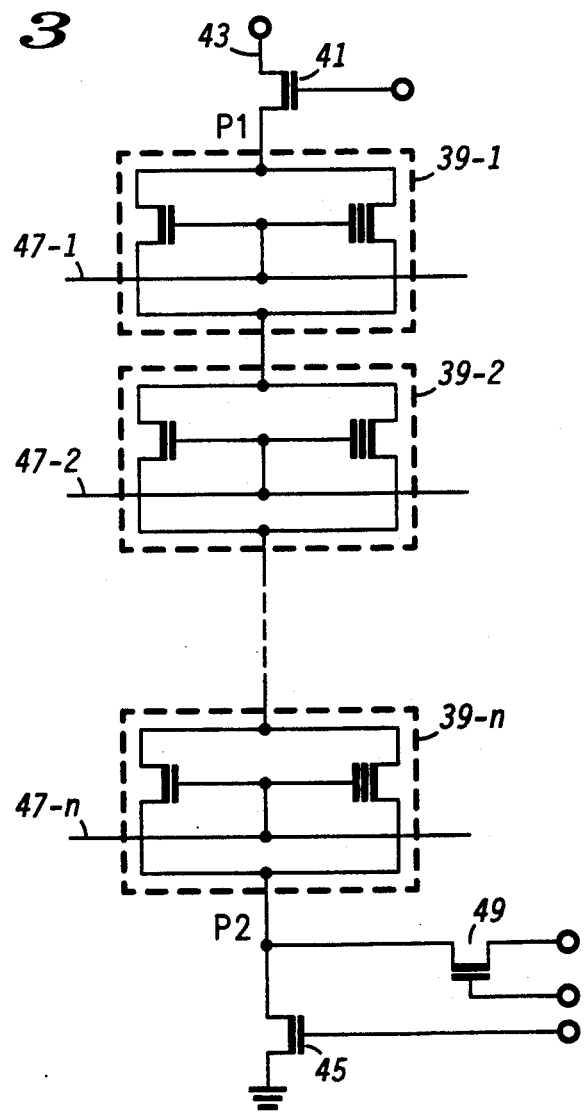
FIG. 3 illustrates one bit portion of a memory device constructed by vertically stacking a plurality of memory cells of FIG. 1.

FIG. 3 illustrates one bit portion of a memory device, into which the above explained parallel transistor circuits are incorporated according to the present invention. In this memory device, a plurality of parallel transistor circuits 39-1, 39-2, . . . 39-n, are serially connected with lower circuit's drain being connected to upper circuit's source, to form a vertically stacking structure.

A bit line 43 is connected to one end node P1 of memory via a MOS transistor 41, which is an upper bit select gate. Bit line 43 is also connected to a sense amplifier and a high voltage generating circuit (not shown). The other end node P2 of memory is connected to ground via a MOS transistor 45, which is an lower bit select gate. Each control gate of memory cells 39-1, 39-2, . . . 39-n is connected to each of word lines 47-1, 47-2, . . . 47-n, respectively. These word lines 47-1, 47-2, . . . 47-n are connected to a word decoder (not shown). A precharge circuit (not shown) is connected to node P2 via a transistor 49.

In order to select, for example, memory cell 39-2 and read out its stored information, a low voltage is supplied to word line 47-2 leading to selected memory cell 39-2, and a high voltage is supplied to all of other word lines. Therefore the enhancement-type MOS transistors in unselected memory cells 39-1, 39-3, . . . 39-n turn on, and their drain-source paths have low impedance. Then upper and lower bit select transistors 41 and 45 are turned on thereby memory cell 39-2 is selected. In this situation, an impedance between bit line 43 and ground is determined by the impedance of the floating gate-type MOS transistor in selected memory cell 39-2. More specifically, if electrons are already injected to the floating gate of the MOS transistor, the transistor is off. On the contrary, if electrons are not injected, the transistor is on. The impedance of the floating gate-type MOS transistor can be detected by sensing current using the sense amplifier (not shown) coupled to bit line 43, to read out the information stored in the selected memory.

In case where the memory cell shown in FIG. 3 is an EPROM type, electrons existing in the floating gate can be removed by irradiating ultraviolet light to cancel the memory cell. In this case, the cancelled state of no electron existing in the floating gate means "on" state or "0" state. In order to select and write "1" into memory cell 39-2, upper bit select transistor 41 and precharging transistor 49 are turned on, and bit line is precharged to 5V. And all word lines 47-1, 47-2, . . . 47-n are leveled up to +5V. Then, lower bit select transistor 45 is turned on to pull down the potential of the bit line, and the voltage level of word line 47-2 of selected cell 39-2 is increased up to a programming high voltage level, for example 20V. In this manner, electrons are injected from the source/drain to the floating gate to accomplish writing "1" into memory cell 39-2.

In case where the memory cell shown in FIG. 3 is an EEPROM type, the state in which electrons exist in the floating gate is "1" state or cancelled state. In order to cancel the cell, upper and lower bit select transistors 41 and 45 are turned on, and the voltage levels of all word lines 47-1, 47-2, . . . 47-n are made 3-5V. Then, word line 47-2 of memory cell 39-2 to be cancelled is supplied with a programming high voltage, for example 12-20V. Thus electrons are injected to the floating gate by tunneling effect to cancel the memory cell. In order to write "0" into a selected memory cell 39-2, upper bit select gate 41 is turned on and lower bit select gate 45 is turned off. And precharging transistor 49 is turned on, and a programming high voltage Vpp is applied via transistor 49 to node P2. At the same time, programming high voltage Vpp generated by a high voltage generating circuit is applied to node P1 via upper bit select transistor 41. Then the voltage level of word line 47-2 of selected memory cell 39-2 is leveled down to 0V, and the levels of all other word lines of unselected cells are increased to high voltage Vpp. Thus, electrons are removed from the floating gate of selected memory cell 39-2 to its drain/source to perform writing "0". Reading of the EEPROM can be done in the same manner as in the EPROM.

Although the parallel transistor circuit according to the present invention was explained above as a memory cell, the circuit of the invention can be utilized for other circuit apparatus requiring non-volatile function. For example, this circuit can be used as a learning circuit by thinning the oxidation layer between the floating gate and the control gate so as to allow electrons to be removed from the floating gate to the control gate depending upon a voltage previously applied to the control gate.

The parallel transistor circuit according to the present invention can provide a non-volatile memory cell function with the minimum area of semiconductor body. A non-volatile memory device can be easily made by vertically stacking the memory cells in a single semiconductor body according to the invention. Further, the NAND structure memory device according to the invention does not require bit line contact for each memory cell which was required in prior NOR structure memory, and high integration can be achieved in the memory device.

While the present invention has been shown and described with reference to particular embodiments thereof, various modifications and changes thereto will be apparent to those skilled in the art and are within the spirit and scope of the present invention.

We claim:

1. A parallel transistor circuit with non-volatile function formed on a single semiconductor substrate to form an EEPROM, comprising:
    an enhancement-type MOS transistor having a drain electrode connected to a drain node, a gate electrode connected to a gate node, and a source electrode connected to a source node, the enhancement-type MOS transistor being further constructed to have a threshold voltage lower than logical high voltages applied to the gate electrode for turning on when a logical high voltage is applied to the gate node and turning off when a logical low voltage is applied to the gate node; and
    a floating gate-type MOS transistor having a drain electrode connected to said drain node, a floating gate, a control gate electrode connected to said gate node, and a source electrode connected to said source node, the floating gate-type MOS transistor being constructed with a thin oxide layer between the floating gate and the drain and source electrodes to allow for electron injection with low voltage on the drain and source electrodes and high voltage on the gate electrode.

2. A semiconductor EEPROM memory device formed by vertically stacking a plurality of memory cells, each of the memory cells comprising:
    an enhancement-type MOS transistor having a drain electrode connected to a drain node, a gate electrode connected to a gate node, and a source electrode connected to a source node, the enhancement-type MOS transistor being further constructed to have a threshold voltage lower than logical high voltages applied to the gate electrode for turning on when a logical high voltage is applied to the gate node and turning off when a logical low voltage is applied to the gate node; and
    a floating gate-type MOS transistor having a drain electrode connected to said drain node, a floating gate, a control gate electrode connected to said gate node, and a source electrode connected to said source node, the floating gate-type MOS transistor being constructed with a thin oxide layer between the floating gate and the drain and source electrodes to allow for electron injection with low voltage on the drain and source electrodes and high voltage on the gate electrode; and
    the drain node of a lower cell being connected to the source node of an upper cell to form the vertical stack of memory cells.

* * * * *